US008153965B1

(12) United States Patent
Adamski et al.

(10) Patent No.: US 8,153,965 B1
(45) Date of Patent: Apr. 10, 2012

(54) APPARATUS AND METHOD FOR MERGING A LOW ENERGY ELECTRON FLOW INTO A HIGH ENERGY ELECTRON FLOW

(75) Inventors: John L. Adamski, Kenmore, WA (US); Benjamin Emerson Carl Koltenbah, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 226 days.

(21) Appl. No.: 12/634,361

(22) Filed: Dec. 9, 2009

(51) Int. Cl.
*H01S 3/02* (2006.01)
*H01J 37/14* (2006.01)

(52) U.S. Cl. ............. 250/305; 250/396 R; 250/396 ML; 250/397; 250/398; 250/251

(58) Field of Classification Search .............. 250/396 R, 250/396 ML, 305, 397, 398, 251
See application file for complete search history.

(56) References Cited

U.S. PATENT DOCUMENTS 3,405,363 A 10/1968 Brown
3,516,037 A 6/1970 Enge
3,936,722 A 2/1976 Goto et al.
4,191,887 A 3/1980 Brown
4,296,327 A * 10/1981 Adamski ................... 250/423 R
4,409,486 A * 10/1983 Bates ..................... 250/396 ML
4,749,857 A * 6/1988 Druaux ......................... 250/251
5,130,994 A * 7/1992 Madey et al. ..................... 372/2
5,177,361 A * 1/1993 Krahl et al. ................... 250/305
5,198,674 A * 3/1993 Underwood ........... 250/396 ML
5,534,699 A * 7/1996 Ferry ........................ 250/396 R
6,617,586 B2 * 9/2003 Woodburn et al. ..... 250/396 ML
6,683,318 B1 * 1/2004 Haberer et al. ............ 250/492.3
6,737,655 B1 * 5/2004 Douglas et al. ........ 250/396 ML
6,885,008 B1 * 4/2005 Douglas et al. ........ 250/396 ML
6,906,487 B2 6/2005 de Frutos
7,582,886 B2 * 9/2009 Trbojevic ................... 250/492.3
7,858,951 B1 * 12/2010 Douglas ................. 250/396 ML

OTHER PUBLICATIONS

Penner, S.; Calculations of Properties of Magnetic Deflection Systems; The Review of Scientific Instruments, vol. 32, No. 2; Feb. 1961.

* cited by examiner

*Primary Examiner* — David A Vanore
(74) *Attorney, Agent, or Firm* — Law Office of Donald D. Mondul

(57) ABSTRACT

An apparatus for merging a low energy electron flow into a high energy electron flow may include: a high energy electron path for accommodating the high energy electron flow; and a plurality of magnetic elements arranged to guide the low energy electron flow through a chicane presenting a path having a first end and a second end. The path intersects the high energy electron path at the second end. The path has a plurality of turns and path segments intermediate the first and second ends. Respective adjacent path segments intersect at each respective turn. The path establishes a respective bend radius and subtends a respective path angle between respective adjacent path segments at each respective turn. Each respective path angle is maximized within predetermined path angle limits. Each respective bend radius is minimized within predetermined bend radius limits.

20 Claims, 6 Drawing Sheets

110

130

150

APPARATUS AND METHOD FOR MERGING A LOW ENERGY ELECTRON FLOW INTO A HIGH ENERGY ELECTRON FLOW

This disclosure was made with Government support under contract number N00014-09-D-0354 awarded by the United States Navy. The government has certain rights in this disclosure.

TECHNICAL FIELD

The present disclosure is directed to managing electron flows, and especially to magnetic particle beam deflector apparatuses and methods. The disclosure is particularly suited for use with energy recovery linac injection merge apparatuses and methods.

BACKGROUND

Merger of a low voltage or low energy electron beam or flow into an energy recovery linac (ERL) apparatus may require a magnetic array to deflect the low energy electron beam onto a main ERL loop presenting a high energy electron flow. For a high average current ERL (in this context we may regard high current as 10 mA or greater average current), the low energy electron beam may comprise a bunch train of relatively high charge micro-pulses (for high average current, ERL beam charge may be typically in the nanocoulomb range). In the process of deflecting the low energy electron beam, space charge forces and natural energy spread in the electron beam may cause emittance growth in the electron beam as it goes through the merger magnetic array. In general, significant emittance growth in the merger may degrade the performance of the ERL.

Existing solutions for the required magnetic array may include constant angle three bend (e.g. left-right-left) chicanes, constant angle four bend (left-right-right-left) chicanes, constant angle four bend (left-right-left-right) dog-leg chicanes, and Z-bend (left-right-left-right—but with the two middle bends twice the bend angle of the outer bends).

The inventors have evaluated several electron merge solutions. For relatively high micropulse charge (in the nanocoulomb range) electron beams the various constant angle bend solutions lead to significant undesirable emittance growth (emittance growth of a few mm-mr may typically be considered to be significant for ERLs). The units "mm-mr" are "millimeter-milliradians". Emittance entering the ERL may be significantly higher than the emittance for the electron source itself.

There is a need for an apparatus and method for merging a low energy electron flow into a high energy electron flow that has low emittance growth for high charge beams to enable the acceleration of high brightness, high current beams.

SUMMARY

An apparatus for merging a low energy electron flow into a high energy electron flow may include: a high energy electron path for accommodating the high energy electron flow; and a plurality of magnetic elements arranged to guide the low energy electron flow through a chicane presenting a path having a first end and a second end. The path intersects the high energy electron path at the second end. The path has a plurality of turns and path segments intermediate the first and second ends. Respective adjacent path segments intersect at each respective turn. The path establishes a respective bend radius and subtends a respective path angle between respective adjacent path segments at each respective turn. Each respective path angle is maximized within predetermined path angle limits. Each respective bend radius is minimized within predetermined bend radius limits.

A method for merging a low energy electron flow into a high energy electron flow may include: (a) providing a high energy electron path for accommodating the high energy electron flow; (b) providing a plurality of magnetic elements; (c) arranging the plurality of magnetic elements to guide the low energy electron flow through a chicane; the chicane presenting a path having a first end and a second end; (d) establishing the path to intersect the high energy electron path at the second end; (e) orienting the path to have a plurality of turns and a plurality of path segments intermediate the first end and the second end; (f) situating respective adjacent path segments of the plurality of path segments to intersect at each respective turn of the plurality of turns; and (g) arranging the path to establish a respective bend radius and subtend a respective path angle between the respective adjacent path segments at each respective turn. Each respective path angle is maximized within predetermined path angle limits. Each respective bend radius is minimized within predetermined bend radius limits.

A system for directing a low energy electron flow may include a plurality of magnetic elements arranged to guide the low energy electron flow through a chicane. The chicane may present a path having a plurality of turns and a plurality of path segments. Respective adjacent path segments of the plurality of path segments may intersect at each respective turn of the plurality of turns. The path may establish a respective bend radius and may subtend a respective path angle between the respective adjacent path segments at each respective turn. Each respective path angle may be maximized within predetermined path angle limits. Each respective bend radius may be minimized within predetermined bend radius limits.

It is, therefore, a feature of the present disclosure to provide an apparatus and method for merging a low energy electron flow into a high energy electron flow that has low emittance growth for high charge and high current beams.

Further features of the present disclosure will be apparent from the following specification and claims when considered in connection with the accompanying drawings, in which like elements are labeled using like reference numerals in the various figures, illustrating the preferred embodiments of the disclosure.

DETAILED DESCRIPTION

Current operational ERL injectors may use shallow entry angles into the ERL. The use of shallow angles may be generally accepted as good practice for beam transport for high energy electron beams because emittance growth may be, in large part, due to chromatic aberration and radiative effects such as wake fields and synchrotron radiation. However, in a high current injector, emittance growth may be primarily due to the effects of space charge. Space charge emittance growth may occur in simple drift spaces, so short drifts could have advantages for beam quality. Non-symmetric beam distributions in space charge influenced transport may result in asymmetric beam distortions that cannot be compensated and may result in emittance growth. This effect may be mitigated by choosing a design with minimum magnetic dispersion (dispersion in this context may refer to the spatial spreading of the electron beam in proportion to its natural energy spread; in a three magnet bend the maximum dispersion may occur in the middle of the center magnet). Solutions may be desirable that have the characteristics of low dispersion, short drift distances and minimum bunching (to avoid increasing the space charge forces more than the original beam from the source, the terminology for bunching strength is $R_{56}$, named for the transport matrix element that measures the longitudinal pulse compression in proportion to the natural energy spread of the electron beam).

Figure 1:
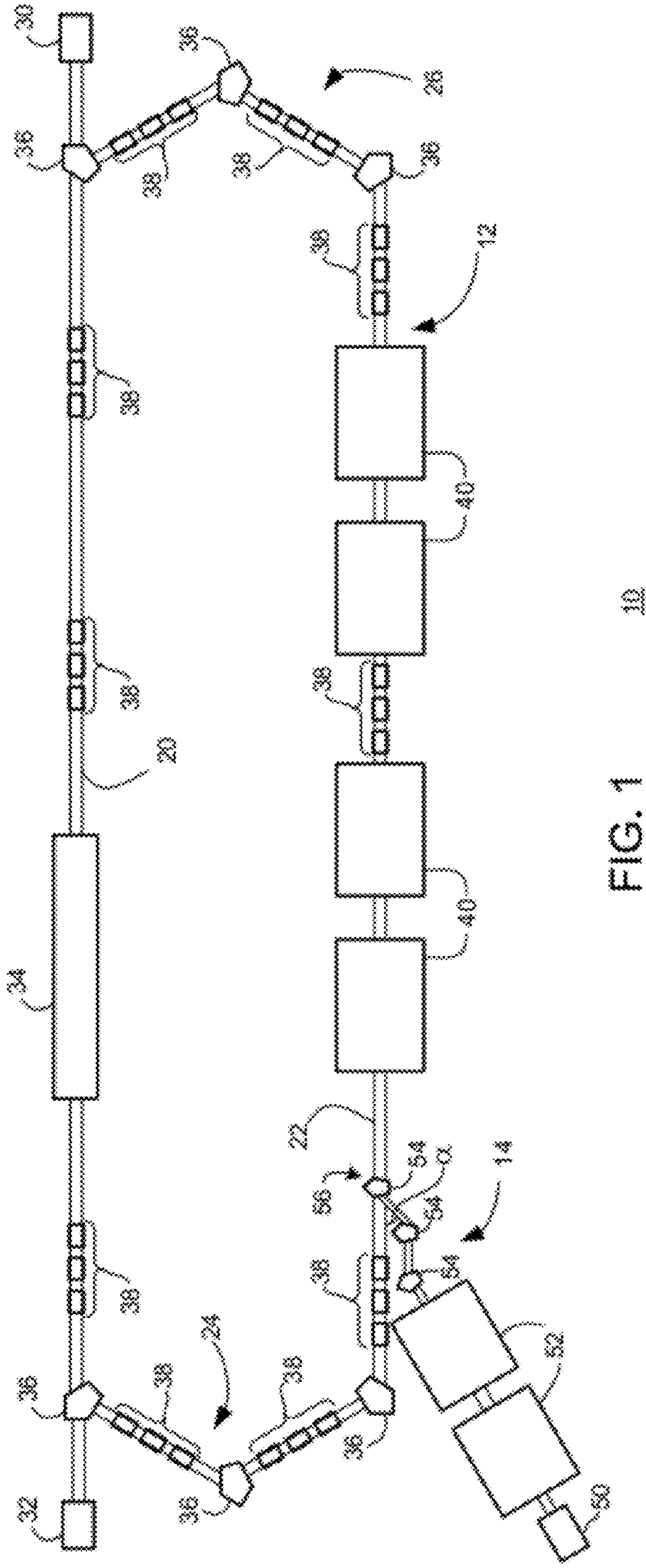
FIG. 1 is a schematic drawing of a representative Energy Recovery Linac (ERL) employing the apparatus of the present disclosure.

FIG. 1 is a schematic drawing of a representative Energy Recovery Linac (ERL) employing the apparatus of the present disclosure. In FIG. 1, an apparatus 10 may include a high energy electron flow path 12 and a low energy electron flow path 14.

High energy electron flow path 12 may be formed substantially in a loop including a delivery straightaway 20 and a return straightaway 22. A beam return arc 24 may connect delivery straightaway 20 with return straightaway 22. A beam delivery arc 26 may connect return straightaway 22 with delivery straightaway 20.

Delivery straightaway 20 may couple an insertion device 34 with other devices using use of a beam traversing high energy electron flow path 12. Insertion device 34 may be embodied in a free electron laser wiggler that may be used to convert a part of an electron beam power to optical power. Such optical power may be transmitted to optical elements located in optics tanks 30 and 32. Magnetic elements 36 may be distributed throughout high energy electron flow path 12 to effect directing of electron flows passing through high energy electron flow path 12. Beam treating elements 38 may be distributed throughout high energy electron flow path 12 to enhance beam focus, effect chromatic correction and carry out similar treatments with regard to electron flows traversing high energy electron flow path 12. ERL accelerator cavity cryomodules 40 may excite, accelerate and focus or otherwise refine and treat electron flows traversing high energy electron flow path 12.

Low energy electron flow path 14 may originate at a beam initiating device 50 and traverse one or more booster cavity devices 52 in cooperation with magnetic elements 54 to establish low energy electron flow path 14 intersecting high energy electron flow path 12 at an injection merge locus 56. Low energy electron flow traversing low energy electron flow path 14 may be injected into a high energy electron flow traversing high energy electron flow path 12 substantially at injection merge locus 56. Beam initiating device 50 may be embodied in, by way of example and not by way of limitation, a photocathode electron source device. A booster cavity device 52 may be placed after beam initiating device 50 to further accelerate the electron beam generated in beam initiating device 50.

One may observe in FIG. 1 that the physical arrangement of high energy electron flow path 12 and low energy electron flow path 14 may occupy more or less space depending upon the angle α at which low energy electron flow path intersects high energy electron flow path 12. A larger angle α may permit a more compact arrangement of apparatus 10 because the larger angle can enable more direct access to the ERL.

Figure 2:
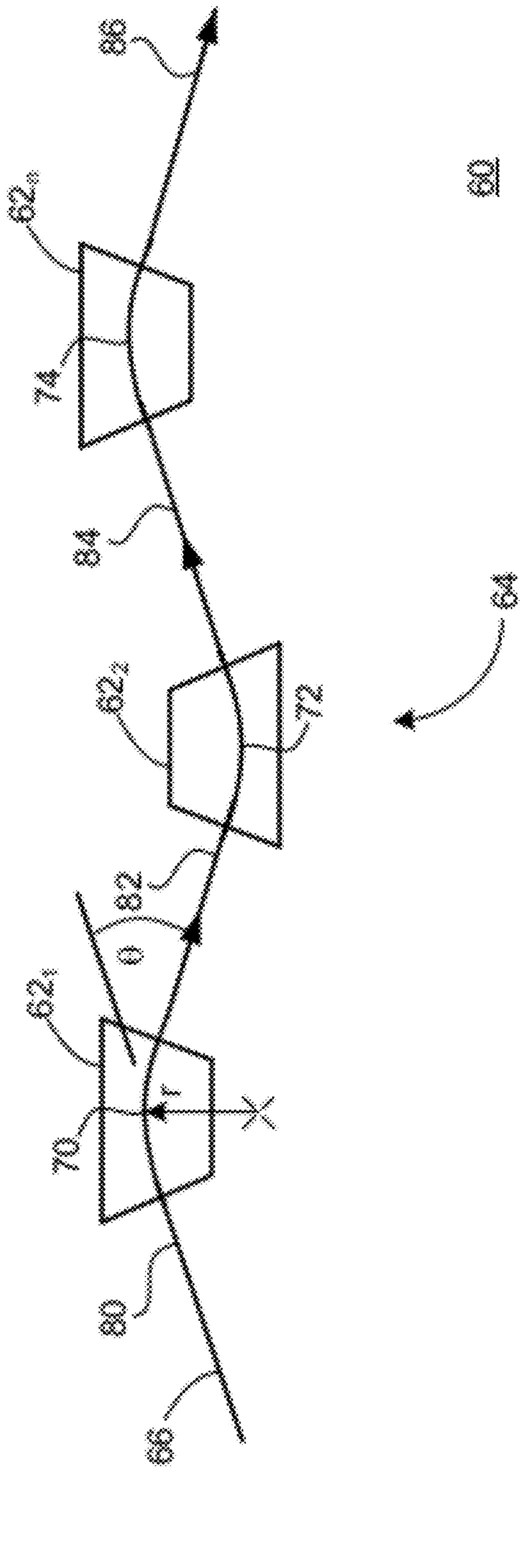
FIG. 2 is a schematic diagram of a representative three-magnet system arranged to guide an electron flow through a chicane.

FIG. 2 is a schematic diagram of a representative three-magnet system arranged to guide an electron flow through a chicane. In FIG. 2, a system 60 for directing an electron flow, such as by way of example and not by way of limitation, a low energy electron flow may include a plurality of magnetic elements $\mathbf{62}_1$, $\mathbf{62}_2$, $\mathbf{62}_n$. The indicator "n" is employed to signify that there can be any number of magnetic in system 60. The inclusion of three magnetic elements $\mathbf{62}_1$, $\mathbf{62}_2$, $\mathbf{62}_n$ in FIG. 2 is illustrative only and does not constitute any limitation regarding the number of magnetic elements that may be included in the system of the present disclosure. Throughout this description, use of a reference numeral using a generic subscript herein may be taken to mean that any respective member of the plurality of elements having the same reference numeral may be regarded as included in the description. Thus, by way of example and not by way of limitation, referring to magnetic element $\mathbf{62}_n$ in describing FIG. 2 may be taken to mean that any magnetic element—$\mathbf{62}_1$, $\mathbf{62}_2$ or $\mathbf{62}_n$ (FIG. 2)—may be regarded as capable of employment as described.

Magnetic elements $\mathbf{62}_n$ may be arranged to guide electron flow through a chicane 64. Chicane 64 may present a path 66 having a plurality of turns 70, 72, 74 and a plurality of path segments 80, 82, 84, 86. Respective adjacent path segments may intersect at respective turns so that path segments 80, 82 may intersect at turn 70; path segments 82, 84 may intersect at turn 72; and path segments 84, 86 may intersect at turn 74. Path 66 may establish a respective bend radius and may subtend a respective path angle between respective adjacent path segments at each turn. Thus, for example, path segments 80, 82 may establish a bend radius r and subtend a path angle θ at turn 70. Other path radii and path angles are not specifically identified or labeled in FIG. 2 to avoid unnecessarily cluttering FIG. 2. Path radii may be the same at each turn 70, 72, 74, but not necessarily. Path angles may be the same at each turn 70, 72, 74, but not necessarily. Each bend radius or path radius r may be minimized within predetermined radius limits. Bend radius may advantageously be minimized within a range of approximately 0.3 meter to approximately 0.1 meter. Each bend angle or path angle θ may be maximized within predetermined path angle limits. Bend angle may advantageously be maximized within a range of approximately forty-five degrees to approximately eighty degrees.

Figure 3:
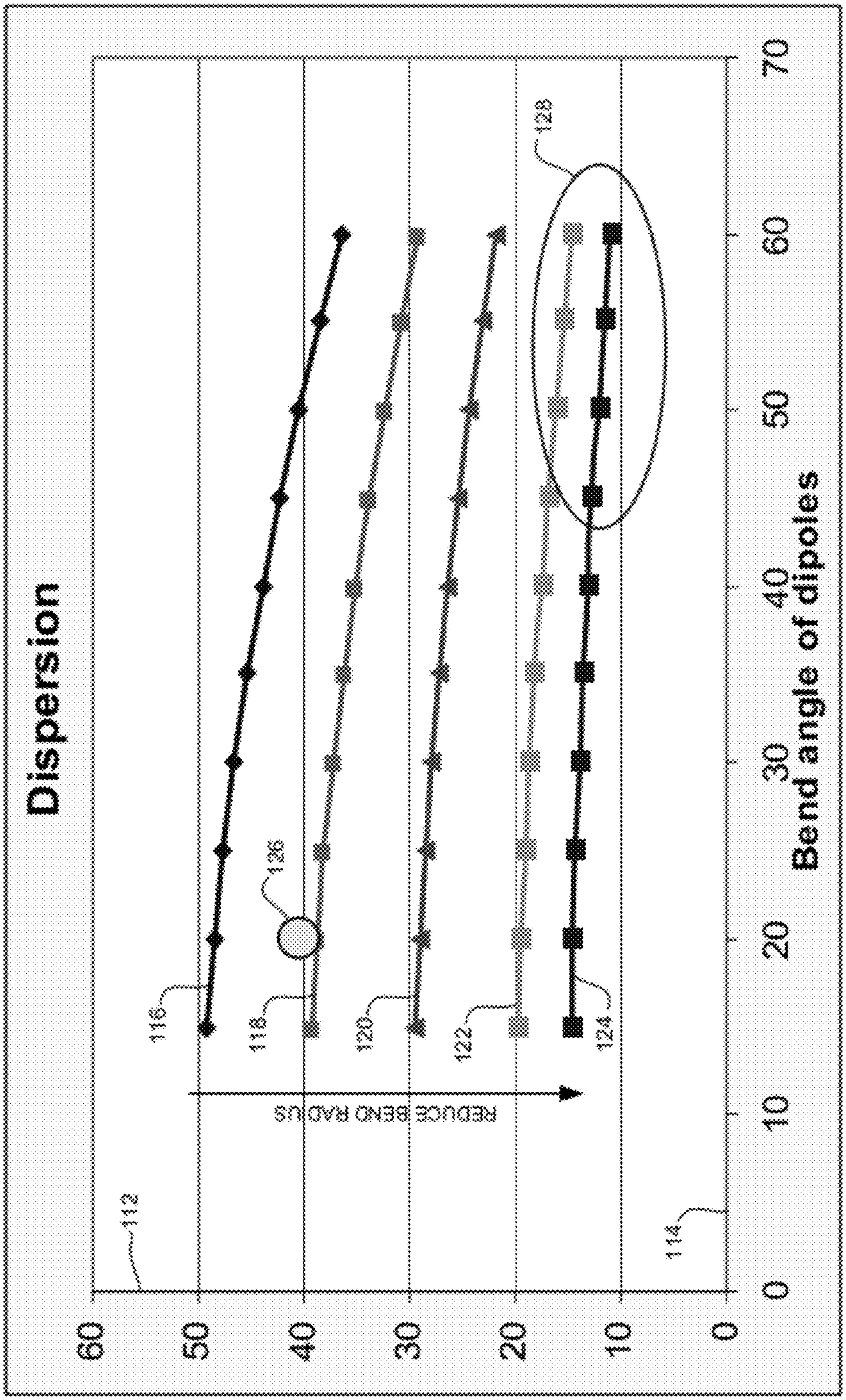
FIG. 3 is a chart illustrating a relationship between dispersion in centimeters per percent energy spread versus a range of dipole bend angles for a variety of bend radii in a system for directing low energy electron flow.

FIG. 3 is a chart illustrating a relationship between dispersion in centimeters per percent energy spread versus a range of dipole bend angles for a variety of bend radii in a system for directing low energy electron flow. Dispersion may be regarded as spatial spreading of an electron beam in proportion to its natural energy spread. In FIG. 3, a graphic representation or chart 110 indicates dispersion on a vertical axis 112 and indicates bend angles on a horizontal axis 114. Data relating to a plurality of bend radii are indicated in a family of curves presented in chart 110. By way of example and not by way of limitation, curve 116 may indicate data related with a bend radius of 0.5 meter. Curve 118 may indicate data related with a bend radius of 0.4 meter. Curve 120 may indicate data related with a bend radius of 0.3 meter. Curve 122 may indicate data related with a bend radius of 0.2 meter. Curve 124 may indicate data related with a bend radius of 0.15 meter.

A circle indicator 126 may indicate parameters consistent with known systems for directing low energy electron flow. Thus, for such known systems, bend radii at turns (e.g., radius r; FIG. 2) may be approximately 0.4 meter and bend angle at turns (e.g., bend angle θ; FIG. 2) may be approximately 18-20 degrees.

An oval indicator 128 may indicate a range for bend angle at an indicated bend radius that may be employed for designing a system for directing low energy electron flow designs having low dispersion.

Figure 4:
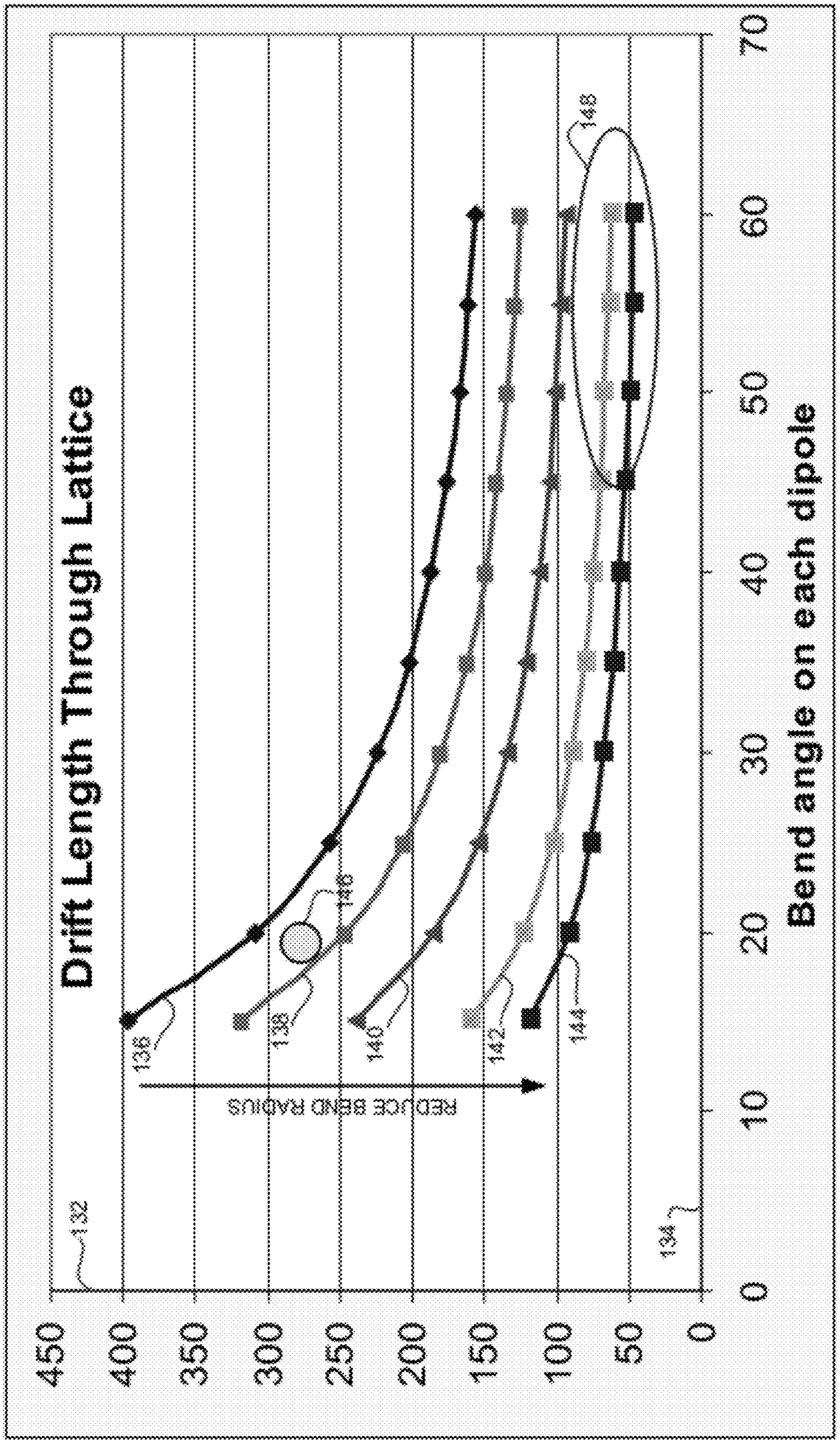
FIG. 4 is a chart illustrating a relationship between drift length in centimeters versus a range of dipole bend angles for a variety of bend radii in a system for directing low energy electron flow.

FIG. 4 is a chart illustrating a relationship between drift length in centimeters versus a range of dipole bend angles for a variety of bend radii in a system for directing low energy electron flow. Drift length may be regarded as a measure of distance or length between magnets in the system. In FIG. 4, a graphic representation or chart 130 indicates drift length on a vertical axis 132 and indicates bend angles on a horizontal axis 134. Data relating to a plurality of bend radii are indicated in a family of curves presented in chart 130. By way of example and not by way of limitation, curve 136 may indicate data related with a bend radius of 0.5 meter. Curve 138 may indicate data related with a bend radius of 0.4 meter. Curve 140 may indicate data related with a bend radius of 0.3 meter. Curve 142 may indicate data related with a bend radius of 0.2 meter. Curve 144 may indicate data related with a bend radius of 0.15 meter.

A circle indicator 146 may indicate parameters consistent with known systems for directing low energy electron flow. Thus, for such known systems, bend radii at turns (e.g., radius r; FIG. 2) may be approximately 0.4 meter and bend angle at turns (e.g., bend angle θ; FIG. 2) may be approximately 18-20 degrees.

An oval indicator 148 may indicate a range for bend angle at an indicated bend radius that may be employed for designing a system for directing low energy electron flow designs having low drift length.

Figure 5:
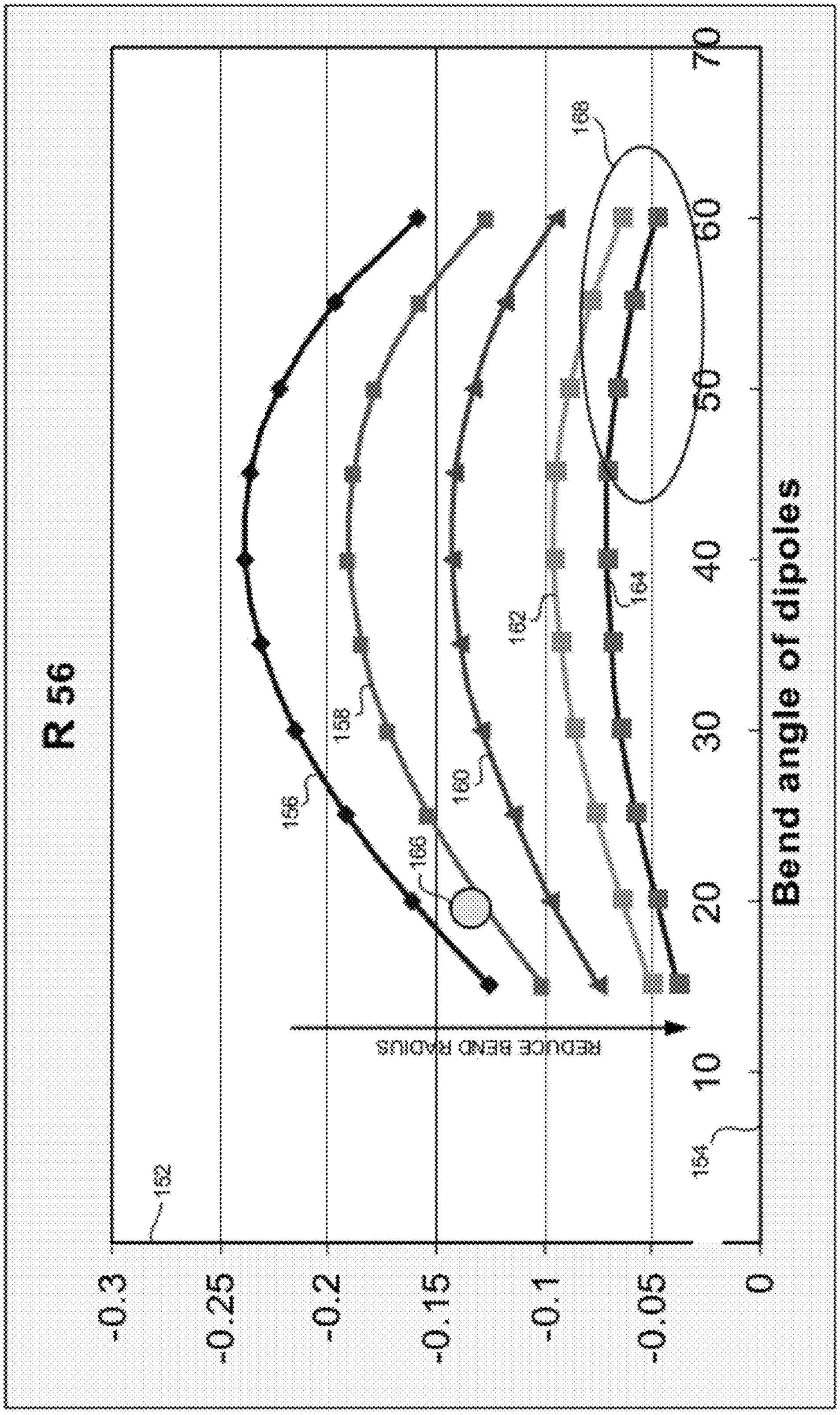
FIG. 5 is a chart illustrating a relationship between a figure of merit for bunching ($R_{56}$) In meters per percent of energy spread versus a range of dipole bend angles for a variety of bend radii in a system for directing low energy electron flow.

FIG. 5 is a chart illustrating a relationship between a figure of merit for bunching ($R_{56}$) In meters per percent of energy spread versus a range of dipole bend angles for a variety of bend radii in a system for directing low energy electron flow. Bunching may be regarded as a measure of linear density of an electron beam with the result of bunching being an increase in the local bunch current and the local bunch space charge. In FIG. 5, a graphic representation or chart 150 indicates bunching (in terms of a figure of merit, $R_{56}$, relating to bunching) on a vertical axis 152 and indicates bend angles on a horizontal axis 154. Data relating to a plurality of bend radii are indicated in a family of curves presented in chart 150. By way of example and not by way of limitation, curve 156 may indicate data related with a bend radius of 0.5 meter. Curve 158 may indicate data related with a bend radius of 0.4 meter. Curve 160 may indicate data related with a bend radius of 0.3 meter. Curve 162 may indicate data related with a bend radius of 0.2 meter. Curve 164 may indicate data related with a bend radius of 0.15 meter.

A circle indicator 166 may indicate parameters consistent with known systems for directing low energy electron flow. Thus, for such known systems, bend radii at turns (e.g., radius r; FIG. 2) may be approximately 0.4 meter and bend angle at turns (e.g., bend angle θ; FIG. 2) may be approximately 18-20 degrees.

An oval indicator 168 may indicate a range for bend angle at an indicated bend radius that may be employed for designing a system for directing low energy electron flow designs having low bunching.

Regarding FIGS. 3-5 together one may conclude that a system for directing low energy electron flow may be advantageously designed to have low dispersion and low bunching if it may be configured having low drift length ($R_{56}$=approximately −0.05 to −0.065), configured to have a bend radius approximately 0.15 to 0.2 meter, and configured to have a bend angle of approximately 46 to 60 degrees. It may be preferable to provide equal bend radii and equal bend angles at each turn (e.g., turns 70, 72, 74; FIG. 2). As a further example of another embodiment, the bend combination may be designed to be achromatic using well known formulas relating the bend radii and the drift distances between magnets.

Figure 6:
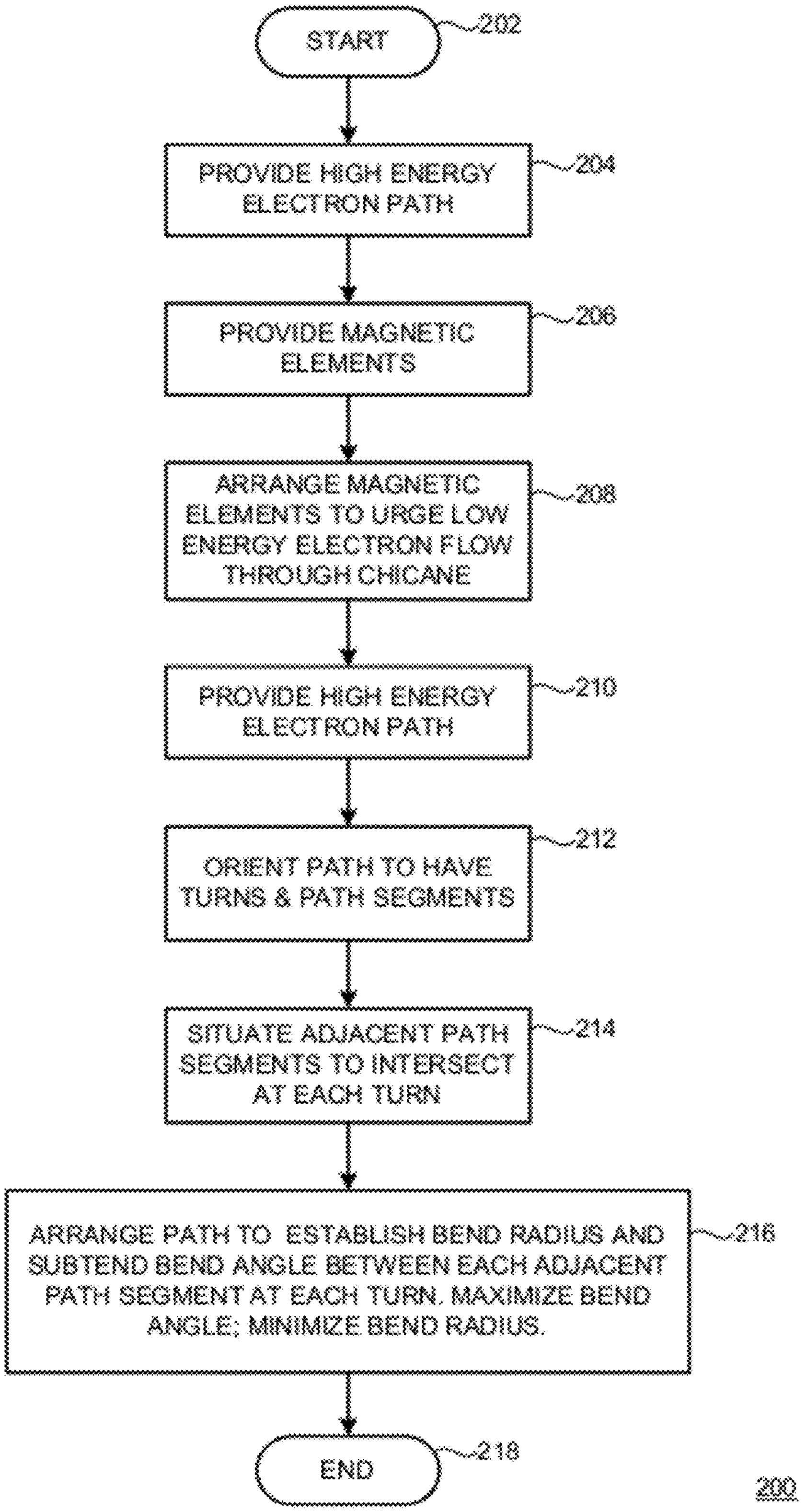
FIG. 6 is a flow chart illustrating the method of the present disclosure.

FIG. 6 is a flow chart illustrating the method of the present disclosure. In FIG. 6, a method 200 for merging a low energy electron flow into a high energy electron flow may begin at a START locus 202. Method 200 may continue with providing a high energy electron path for accommodating the high energy electron flow, as indicated by a block 204.

Method 200 may continue with providing a plurality of magnetic elements, as indicated by a block 206.

Method 200 may continue with arranging the plurality of magnetic elements to guide the low energy electron flow through a chicane; the chicane presenting a path having a first end and a second end, as indicated by a block 208.

Method 200 may continue with establishing the path to intersect the high energy electron path at the second end, as indicated by a block 210.

Method 200 may continue with orienting the path to have a plurality of turns and a plurality of path segments intermediate the first end and the second end, as indicated by a block 212.

Method 200 may continue with situating respective adjacent path segments of the plurality of path segments to intersect at each respective turn of the plurality of turns, as indicated by a block 214.

Method 200 may continue with arranging the path to establish a respective bend radius and subtend a respective path angle between the respective adjacent path segments at each the respective turn, as indicated by a block 216. Each respective path angle may be maximized within predetermined path angle limits. Each respective bend radius may be minimized within predetermined bend radius limits.

Method 200 may terminate at an END locus 218.

The present disclosure may present a novel configuration of a three dipole chicane to achieve a magnetic transport that has low dispersion (spreading of the beam spatially in proportion to its natural energy spread) and short drift lengths through the magnetic transport established by a plurality of magnetic elements arranged in a magnetic array. The low dispersion may minimize differential spreading of the beam in the horizontal and vertical planes, which may help keep the effects of space charge induced spreading similar in the horizontal and vertical planes. Short drift lengths may help limit emittance growth which may be caused by space charge spreading in the horizontal and vertical planes. The array may also be achromatic. Achromaticity may be important to reduce distortion of a beam caused by energy differences. The present disclosure may present a compact achromatic triple bend merge magnetic array with good emittance preservation that employs short bend radii and large bend angles. The bend radii and bend angle design may permit advantageous placement of the electron source for the low energy electron path close to the main ERL ring (i.e., the high energy electron path) at an angle that provides good clearance around other ERL components.

It is to be understood that, while the detailed drawings and specific examples given describe various embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A system for directing an electron flow; the system comprising: a plurality of magnetic elements arranged to guide said electron flow through a chicane; said chicane presenting a path having a plurality of turns and a plurality of path segments; respective adjacent path segments of said plurality of path segments intersecting at each respective turn of said plurality of turns; said path establishing a respective bend radius and subtending a respective path angle between said respective adjacent path segments at each said respective turn; each said respective path angle being maximized within predetermined path angle limits to reduce dispersion of said electron flow as said path angle approaches eighty degrees; each said respective bend radius being minimized within predetermined bend radius limits to improve a figure of merit $R_{56}$ as said bend radius is shortened toward a length greater than zero.

2. The system for directing an electron flow as recited in claim 1 wherein said respective path angle is maximized within a range of approximately fifty degrees to approximately eighty degrees.

3. The system for directing an electron flow as recited in claim 2 wherein said respective bend radius is minimized within a range of approximately 0.3 meter to approximately 0.1 meter.

4. The system for directing an electron flow as recited in claim 1 wherein said respective bend radius is minimized within a range of approximately 0.3 meter to approximately 0.1 meter.

5. The system for directing an electron flow as recited in claim 1 wherein said respective path angle at each said respective turn is substantially equal.

6. The system for directing an electron flow as recited in claim 1 wherein said respective bend radius at each said respective turn is substantially equal.

7. The system for directing an electron flow as recited in claim 6 wherein said respective path angle at each said respective turn is substantially equal; wherein said respective path angle is maximized within a range of approximately fifty degrees to approximately eighty degrees; and; wherein said respective bend radius is minimized within a range of approximately 0.3 meter to approximately 0.1 meter.

8. An apparatus for merging a low energy electron flow into a high energy electron flow; the apparatus comprising: a high energy electron path for accommodating said high energy electron flow; and a plurality of magnetic elements arranged to guide said low energy electron flow through a chicane; said chicane presenting a path having a first end and a second end; said path intersecting said high energy electron path at said second end; said path having a plurality of turns and a plurality of path segments intermediate said first end and said second end; respective adjacent path segments of said plurality of path segments intersecting at each respective turn of said plurality of turns; said path establishing a respective bend radius and subtending a respective path angle between said respective adjacent path segments at each said respective turn; each said respective path angle being maximized within predetermined path angle limits; each said respective bend radius being minimized within predetermined bend radius limits.

9. The apparatus for merging a low energy electron flow into a high energy electron flow as recited in claim 8 wherein said respective path angle is maximized within a range of approximately forty-five degrees to approximately eighty degrees.

10. The apparatus for merging a low energy electron flow into a high energy electron flow as recited in claim 9 wherein said respective bend radius is minimized within a range of approximately 0.3 meter to approximately 0.10 meter.

11. The apparatus for merging a low energy electron flow into a high energy electron flow as recited in claim 8 wherein said respective bend radius is minimized within a range of approximately 0.3 meter to approximately 0.1 meter.

12. The apparatus for merging a low energy electron flow into a high energy electron flow as recited in claim 8 wherein said respective path angle at each said respective turn is substantially equal.

13. The apparatus for merging a low energy electron flow into a high energy electron flow as recited in claim 8 wherein said respective bend radius at each said respective turn is substantially equal.

14. The apparatus for merging a low energy electron flow into a high energy electron flow as recited in claim 13 wherein said respective path angle at each said respective turn is substantially equal; wherein said respective path angle is maximized within a range of approximately forty-five degrees to approximately eighty degrees; and; wherein said respective bend radius is minimized within a range of approximately 0.3 meter to approximately 0.1 meter.

15. A method for merging a low energy electron flow into a high energy electron flow; the method comprising:

(a) providing a high energy electron path for accommodating said high energy electron flow;
(b) providing a plurality of magnetic elements;
(c) arranging said plurality of magnetic elements to guide said low energy electron flow through a chicane; said chicane presenting a path having a first end and a second end;
(d) establishing said path to intersect said high energy electron path at said second end;
(e) orienting said path to have a plurality of turns and a plurality of path segments intermediate said first end and said second end;
(f) situating respective adjacent path segments of said plurality of path segments to intersect at each respective turn of said plurality of turns; and
(g) arranging said path to establish a respective bend radius and subtend a respective path angle between said respective adjacent path segments at each said respective turn; each said respective path angle being maximized within predetermined path angle limits; each said respective bend radius being minimized within predetermined bend radius limits.

16. The method for merging a low energy electron flow into a high energy electron flow as recited in claim 15 wherein said respective path angle is maximized within a range of approximately forty-five degrees to approximately eighty degrees.

17. The method for merging a low energy electron flow into a high energy electron flow as recited in claim 16 wherein said respective bend radius is minimized within a range of approximately 0.3 meter to approximately 0.0.10 meter.

18. The method for merging a low energy electron flow into a high energy electron flow as recited in claim 15 wherein said respective bend radius is minimized within a range of approximately 0.3 meter to approximately 0.1 meter.

19. The method for merging a low energy electron flow into a high energy electron flow as recited in claim 15 wherein said respective path angle at each said respective turn is substantially equal, and wherein said respective bend radius at each said respective turn is substantially equal.

20. The method for merging a low energy electron flow into a high energy electron flow as recited in claim 19 wherein said respective path angle at each said respective turn is substantially equal; wherein said respective path angle is maximized within a range of approximately forty-five degrees to approximately eighty degrees; and; wherein said respective bend radius is minimized within a range of approximately 0.3 meter to approximately 0.1 meter.

* * * * *